US010290623B2

(12) United States Patent
Roberts et al.

(10) Patent No.: US 10,290,623 B2
(45) Date of Patent: May 14, 2019

(54) GATE INPUT PROTECTION FOR DEVICES AND SYSTEMS COMPRISING HIGH POWER E-MODE GAN TRANSISTORS

(71) Applicant: GaN Systems Inc., Ottawa (CA)

(72) Inventors: John Roberts, Kanata (CA); Hugues Lafontaine, Ottawa (CA)

(73) Assignee: GaN Systems Inc., Ottawa (CA)

( * ) Notice: Subject to any disclaimer, the term of this patent is extended or adjusted under 35 U.S.C. 154(b) by 346 days.

(21) Appl. No.: 15/131,309

(22) Filed: Apr. 18, 2016

(65) Prior Publication Data

US 2016/0307886 A1    Oct. 20, 2016

Related U.S. Application Data

(60) Provisional application No. 62/148,245, filed on Apr. 16, 2015.

(51) Int. Cl.
*H01L 27/02* (2006.01)

(52) U.S. Cl.
CPC ................. *H01L 27/0248* (2013.01)

(58) Field of Classification Search
CPC ............ H01L 27/0248; H01L 27/0266; H01L 29/778; H01L 29/2003
USPC .......................................................... 361/56
See application file for complete search history.

(56) References Cited

U.S. PATENT DOCUMENTS

| 4,930,036 | A | 5/1990 | Sitch |
| 4,987,465 | A * | 1/1991 | Longcor ............ H01L 27/0259 |
| | | | 257/357 |
| 5,774,318 | A | 6/1998 | McClure et al. |
| 6,614,633 | B1 | 9/2003 | Kohno |
| 7,027,276 | B2 | 4/2006 | Chen |
| 7,408,752 | B2 | 8/2008 | Ma et al. |
| 7,495,265 | B2 * | 2/2009 | Morishita ........... H01L 27/0262 |
| | | | 257/115 |
| 8,144,441 | B2 | 3/2012 | Ping et al. |
| 9,225,163 | B2 | 12/2015 | Cao et al. |
| 9,413,166 | B2 | 8/2016 | Rupp et al. |
| 9,537,338 | B2 | 1/2017 | Kinzer et al. |
| 2004/0057172 | A1 | 3/2004 | Sun |
| 2007/0223158 | A1 | 9/2007 | Ma et al. |

(Continued)

OTHER PUBLICATIONS

Zaremba, Don; ON Semiconductor Application note; "Low-Side Self-Protected MOSFET"; AND8202/D; Feb. 2011; pp. 1-13.

*Primary Examiner* — Kevin J Comber
(74) *Attorney, Agent, or Firm* — Miltons IP/p.i.

(57) ABSTRACT

An integrated gate protection device P for a GaN power transistor D1 provides negative ESD spike protection. Protection device P comprises a smaller gate width $w_g$ enhancement mode GaN transistor Pm. The source of Pm is connected to its gate, the drain of Pm is connected to the gate input of D1, and the source of Pm is connected to the intrinsic source of D1. When the gate input voltage is taken negative below the threshold voltage for reverse conduction, Pm conducts and quenches negative voltage spikes. When device P comprises a plurality of GaN protection transistors P1 to Pn, connected in series, it turns on when the gate input voltage applied to the drain of P1 goes negative by more than the sum of the threshold voltages of P1 to Pn. The combined gate width of P1 to Pn is selected to limit the gate voltage excursion of D1.

12 Claims, 9 Drawing Sheets

(56) References Cited

U.S. PATENT DOCUMENTS

| | | |
|---|---|---|
| 2008/0062595 A1 | 3/2008 | Ping et al. |
| 2013/0127500 A1 | 5/2013 | Kobayashi et al. |
| 2014/0015591 A1 | 1/2014 | Chen et al. |
| 2014/0092508 A1 | 4/2014 | Ko et al. |
| 2016/0079978 A1 | 3/2016 | Kinzer et al. |
| 2016/0155737 A1* | 6/2016 | Linewih .................. H02H 9/04 361/56 |
| 2016/0372920 A1 | 12/2016 | Kinzer et al. |

* cited by examiner

GATE INPUT PROTECTION FOR DEVICES AND SYSTEMS COMPRISING HIGH POWER E-MODE GAN TRANSISTORS

CROSS-REFERENCE TO RELATED APPLICATION(S)

This application claims priority from U.S. Provisional Patent Application No. 62/148,165, filed Apr. 16, 2015, entitled "GATE INPUT PROTECTON FOR DEVICES AND SYSTEMS COMPRISING HIGH POWER E-MODE GaN TRANSISTORS", which is incorporated herein by reference, in its entirety.

TECHNICAL FIELD

This invention relates to devices and systems comprising high voltage gallium nitride (GaN) transistors, such as GaN power switches for automotive and other applications; it relates particularly to gate input protection or ESD protection for high-power, normally-off or enhancement-mode (E-Mode) lateral GaN transistors, such as GaN High Electron Mobility Transistors (GaN HEMTs).

BACKGROUND ART

The need for gate input protection and ESD protection circuitry has long been recognized. For CMOS circuits and silicon MOSFET power devices and systems, arrangements of Zener diodes may be used for overvoltage and ESD protection of the gates of MOSFET devices (see for example "Low-Side Self Protected MOSFET", ON Semiconductor Application note, February 2011).

US2014/0092508 (Ko) discloses a clamping circuit which detect a change in level of a gate voltage due to ESD, and clamps the gate voltage of the high voltage transistor.

US2013/0127500 (Kobayishi) discloses a circuit such that when an electric discharge is generated between the drain terminal and the gate control terminal of a power transistor the gate of the power semiconductor device is charged to turn on and absorb the surge energy, i.e. suppress the surge voltage applied to the drain terminal and prevent breakdown of the power semiconductor device.

For power switching applications, large area, lateral GaN transistors of many performance benefits, e.g. low on-resistance, high current capability, higher Figure of Merit (FOM), relative to Si power MOSFETS and IGBTs. Thus lateral GaN power transistors systems are being developed rapidly and gaining traction for applications such as switching circuitry for electric vehicles. However, gate input protection and ESD protection of lateral GaN power transistors is a particular challenge relative to MOSFET power devices.

On the other hand, the gate of a lateral GaN power transistor has a relatively low ESD rating, which means that the gate structure is relatively "fragile", i.e. more sensitive to overvoltage spikes compared to the gate structure of MOSFET power devices. Despite other advantages of lateral GaN power devices, for some applications, this issue may be potential disadvantage and creates a significant handling problem.

As disclosed in US patent publication no. 2014/0015591 (Chen), gate voltage limiting and transient voltage suppression for group III-nitride semiconductor devices such as GaN HEMTs can be achieved with discrete silicon Zener diodes. However, integrated Zener diodes with a suitable Zener breakdown voltage cannot be fabricated using a GaN hetero-structure. Thus Chen discloses providing gate protection to a group III—semiconductor device by embedding a gate-voltage-controlling second transistor, in series with the gate electrode of a first transistor. The gate-voltage-controlling second transistor may be gate-source connected depletion mode GaN transistor. That, is first gate electrode of the first semiconductor device is in series with a second source electrode of the second semiconductor device, and a second gate electrode of the second semiconductor device is connected to the second source electrode and the first gate electrode.

Based on ESD testing of large area, E-mode lateral GaN power transistors, the present Applicant/Inventors have observed that positive ESD voltage spikes on the gate are better tolerated, since the gate is more robust in that direction, while ESD damage tends to be caused by negative voltage spikes on the gate. Prior art solutions, such as the above references, focus on protection against positive spikes rather than negative spikes.

Thus, there is a need to improved ESD protection for the gate input of GaN power transistors, particularly for protection against negative voltage spikes.

SUMMARY OF INVENTION

Thus the present invention seeks to provide an integrated gate protection device for devices and systems comprising GaN power transistors, particularly for large area, lateral GaN power transistors, such as E-mode GaN HEMTs.

One aspect of the invention provides a GaN power switching device comprising a GaN power transistor D1 and an integrated gate protection device P, the GaN power transistor D1 comprising an enhancement mode GaN power transistor of gate width $W_g$;

the integrated gate protection device P comprising a GaN protection transistor Pm comprising an enhancement mode GaN transistor of smaller gate width $w_g$, the gate of the GaN protection transistor Pm being connected to the source of the GaN protection transistor Pm, the drain of the GaN protection transistor Pm being connected to the gate input of the first GaN transistor, and the source of the GaN protection transistor Pm being connected to the intrinsic source of the GaN power transistor D1;

wherein, the GaN protection device P is normally off, and when a gate input voltage of the GaN power transistor D1 applied to the drain of the GaN protection transistor Pm is taken negative by more than the threshold voltage for reverse conduction of GaN protection transistor Pm, the protection device P conducts.

Another aspect of the invention provides a GaN power switching device comprising a GaN power transistor D1 and an integrated gate protection device P, the GaN power transistor D1 comprising an enhancement mode GaN power transistor of gate width $W_g$;

the protection device P comprising first and second GaN protection transistors P1 and P2, each having its gate connected to its source, the first and second GaN protection transistors being connected in series as a stack, with the source of the first GaN protection transistor P1 being connected to the drain of the second GaN protection transistor P2; the drain of the first GaN protection transistor P1 being connected to the gate input of the GaN power transistor, and the source of the second GaN protection transistor P2 being connected to the intrinsic source of the GaN power transistor D1;

wherein, the GaN protection transistors P1 and P2 is normally off, and when the gate input voltage of the GaN power transistor D1 applied to the drain of P1 is taken negative voltage for reverse conduction by more than the sum of the threshold voltages of the first and second GaN protection transistors P1 and P2, the protection device P conducts.

Yet another aspect of the invention provides a GaN power switching device comprising a GaN power transistor D1 and an integrated gate protection device P, the GaN power transistor D1 comprising an enhancement mode GaN power transistor having a drain, an intrinsic source and a gate of gate width Wg;

the integrated gate protection device comprising a plurality n of GaN protection transistors P1, P2, . . . Pn, each comprising an enhancement mode GaN transistor having a drain, a source and a gate of gate width $w_g$ smaller than Wg, the gate of each GaN protection transistor P1, P2, . . . Pn being connected to its source;

the n GaN protection transistors being connected in series as a stack, for i=1 to n−1, the source of the ith GaN protection transistor being connected to the drain of the i+1th GaN protection transistor, the drain of GaN protection transistor P1 being connected to a gate input of the GaN power transistor D1, the source of the nth GaN protection transistor Pn being connected to the intrinsic source of the GaN power transistor D1;

an effective threshold voltage of the protection device P comprising the stack of n GaN protection transistors being the sum of the threshold voltages for reverse conduction of each of the n GaN protection transistors P1, P2, . . . Pn, wherein, the GaN protection device P is normally off, and when the gate the input voltage of the GaN power transistor applied to the drain of P1 is taken negative by more than the effective threshold voltage, the GaN protection device P conducts; and a gate width of the protection device P being a combined gate width of the stack of n GaN protection transistors P1, P2, . . . Pn, the gate width of the protection device P being selected to limit a negative gate voltage excursion of the gate of the GaN power transistor Dl; and wherein number n of GaN protection transistors P1, P2, . . . Pn is selected to provide the effective threshold voltage of the GaN protection device P is −3V or less.

Advantageously, in some embodiments, the number n of GaN protection transistors is selected to provide an effective threshold voltage of −3V or less, and the gate width of the protection device P is selected to limit the gate voltage excursion of the GaN power transistor D1, e.g. to maintain it above −10V. Optionally, an integrated resistor is provided between the gate input of D1 and the connection to the drain of P1.

This protection device arrangement takes advantage of the intrinsic reverse conduction mode of enhancement mode GaN transistors when the gate is taken negative to the threshold voltage for reverse conduction −Vt. This device structure quenches such negative voltage spikes. The GaN protection transistor is normally off, but turns on as soon as its drain, i.e. the gate of the first GaN power transistor, goes negative by more than the threshold voltage, i.e. about −1.6V.

Beneficially, the GaN protection transistor is made as small as possible to take up less area of the chip. As an example, a GaN protection transistor having a gate width $w_g$ of 0.7 mm can provides protection for a large area GaN transistor having a gate wide $W_g$ of 300 mm.

Advantageously, the protection device may comprise a plurality of n GaN protection transistors, each having its gate connected to its source. In this arrangement, the threshold for turning on the protection device is the sum of the threshold voltages of the n GaN protection devices.

For example, a double stack of two GaN protection transistors having a combined gate width of 1.4 mm keeps the gate voltage Vg of the GaN power transistor above a critical −10V limit.

Thus the number of protection transistors in the stack is selected to control the effective threshold voltage to turn on the protection device and the combined gate width of the stack of the plurality of protection transistors is selected to limit the gate voltage seen by the GaN power transistor D1.

In other embodiments an integrated protection device is provided for positive spike ESD protection. Thus, a further aspect of the invention provides a GaN power switching device comprising a GaN power transistor D1 and an integrated gate protection device P, the GaN power transistor D1 comprising an enhancement mode GaN power transistor having a drain, an intrinsic source and a gate of gate width $W_g$;

the integrated gate protection device comprising a plurality n of GaN protection transistors P1, P2, . . . .Pn, each comprising an enhancement mode GaN transistor having a drain, a source and a gate of gate width $w_g$ smaller than Wg, the gate of each GaN protection transistor P1, P2, . . . Pn being connected to its drain;

the n GaN protection transistors being connected in series as a stack, for i=1 to n−1, the source of the ith GaN protection transistor being connected to the drain of the i+1th GaN protection transistor, the drain of first GaN protection transistor P1 being connected to a gate input of the GaN power transistor D1, the source of the nth GaN protection transistor Pn being connected to the intrinsic source of the GaN power transistor D1;

an effective threshold voltage of the protection device comprising the stack of n GaN protection transistors being the sum of the threshold voltages for conduction of each the n GaN protection transistors, wherein, the GaN protection device P is normally off, and when a gate the input voltage of the GaN power transistor applied to the drain of P1 is taken positive by more than the effective threshold voltage, the GaN protection device P conducts; and a gate width of the protection device P being a combined gate width of the stack of n GaN protection transistors P1, P2, . . . .Pn, the gate width of the protection device P being selected to limit a positive gate voltage excursion of the gate of GaN power transistor D1; and wherein number n of GaN protection transistors P1 to Pn is selected to set the effective threshold voltage of the GaN protection device P to be at least 8V.

The number n of GaN protection transistors P1 to Pn is selected to provide an effective threshold voltage for turning on the protection device P. The gate width of the protection device P is selected to limit the gate voltage excursion of the GaN power transistor D1 to a selected critical value, e.g. at least 8V, and preferably a peak voltage in the range of not more than 10V to 16V.

In other embodiments wherein the protection device P comprises a single enhancement mode transistor Pm of gate width wg smaller than the gate width $W_g$ of the GaN power transistor D1, the GaN power switching device further comprises a voltage divider connected between the drain and source of the protection transistor Pm for controlling the gate voltage to the protection device P at which the protection transistor turns on, the voltage divider dividing the input voltage in a ratio such that the protection device P becomes active if the voltage at the gate input exceeds the threshold voltage of protection transistor Pm by a selected multiple n of the threshold voltage of protection transistor Pm, and wherein, because the protection transistor Pm can conduct in either direction, positive and negative excess voltages are thereby clamped to protect the power switch D1.

Preferably, the voltage divider comprises an integrated voltage divider comprising a string of a plurality n of small enhancement mode GaN protection transistors P1 to Pn, each having a smaller gate width than the protection transistor Pm, and arranged to divide the input voltage in a required ratio; each of the string of GaN protection transistors P1 to Pn having its gate connected to its drain, with the drain of the first transistor P1 being connected to the gate input of GaN power transistor D1 and the source of nth transistor being connected to the source of protection transistor Pm, and the drain of the nth transistor Pn being connected to the gate of protection transistor Pm.

Another aspect of the invention provides a GaN power switching device comprising a GaN power transistor D1 and an integrated gate protection device P for negative and positive ESD spike protection, the GaN power transistor D1 comprising an enhancement mode GaN power transistor of gate width Wg;

the integrated gate protection device P comprising a GaN protection transistor Pm comprising an enhancement mode GaN transistor of smaller gate width $w_{g(m)}$, the gate of the GaN protection transistor Pm being connected to the source of the GaN protection transistor Pm, the drain of the GaN protection transistor Pm being connected to the gate input of the GaN power transistor D1, and the source of the GaN protection transistor Pm being connected to the intrinsic source of the GaN power transistor D1;

wherein, the GaN protection device P is normally off, and when gate input voltage of the GaN power transistor D1 applied to the drain of the GaN protection transistor Pm is taken negative by more than the threshold voltage for reverse conduction of GaN protection transistor Pm, the protection device P conducts; and a string of a plurality n of small enhancement mode GaN protection transistors P1 to Pn, each having a smaller gate width $w_{g(n)}$ than that of the protection transistor Pm, P1 to Pn being arranged as a voltage divider to divide the input voltage in a required ratio; each of the string of GaN protection transistors having its gate connected to its drain, with the drain of the P1 transistor being connected to the gate input of D1 and the source of Pn being connected to the source of protection transistor Pm, and the drain of the protection transistor Pn being connected to the gate of protection transistor Pm, wherein, the voltage divider divides the input voltage in a ratio such that the protection device P becomes active if the voltage at the gate input exceeds the threshold voltage of protection transistor Pm by a selected multiple of the threshold voltage of protection transistor Pm.

For example, for P1 to Pn each having a threshold voltage of ~1.6V, n=6 to provide a turn on voltage of about 10V. The gate widths of protection transistors Pm and P1 to Pn are selected to limit the peak voltage excursion to 12V, for example, for a protection transistor Pm having a gate width $w_{g(m)}$ of 25 mm, each of the string of enhancement mode GaN protection transistors P1 to P6 having a gate width $w_{g(n)}$ of 0.5 mm.

Thus, integrated protection device arrangements are provided for ESD protection of devices and systems comprising GaN power transistors, with particular application to gate input protection for large area, lateral GaN HEMTS, that mitigate or circumvent one or more limitations of known devices and systems.

BRIEF DESCRIPTION OF THE DRAWINGS

In the drawings, identical or corresponding elements in the different Figures have the same reference numeral, or corresponding elements have reference numerals incremented by 100 in successive Figures.

The foregoing and other objects, features, aspects and advantages of the present invention will become more apparent from the following detailed description, taken in conjunction with the accompanying drawings, of preferred embodiments of the invention, which description is by way of example only.

DETAILED DESCRIPTION OF EMBODIMENTS

Figure 1:
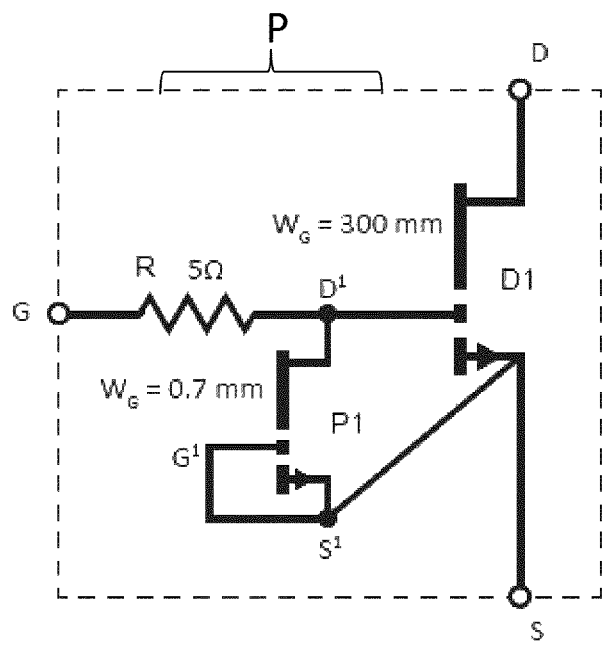
FIG. 1 shows a circuit schematic of a device comprising a large area lateral GaN transistor with an integrated gate input protection transistor arrangement according to a first embodiment.

FIG. 1 shows a circuit schematic of a GaN power switching device 100 comprising a large area lateral GaN power transistor D1 with an integrated gate input protection device P according to a first embodiment. The GaN power transistor, D1 is, for example, a large area, enhancement mode (E-mode) lateral GaN HEMT (High Electron Mobility Transistor) having a large gate width Wg, e.g. 300 mm. The integrated gate protection device comprises a GaN protection transistor P1 (or more generally referred to as Pm). P1 is another E-mode GaN transistor of smaller gate width $w_g$ than D1. The gate G' of the GaN protection transistor P1 is connected to the source S' of the GaN protection transistor P1. The source S' of the GaN protection transistor P1 is connected to the intrinsic source of the GaN power transistor D1, and the drain D' of the GaN protection transistor P1 is connected to the gate input G of the GaN power transistor D1.

This protection device arrangement takes advantage of the intrinsic reverse conduction of E-mode GaN transistors when the gate of the GaN protection transistor P1 is taken negative below the threshold voltage for reverse conduction −Vt. Thus, this device structure acts as a shunt that quenches such negative voltage spikes. The GaN protection transistor P1 is normally off, but turns on as soon as its drain D', i.e. the gate G of the GaN power transistor D1, goes negative by more than the threshold voltage of P1, i.e. about −1.6V.

Beneficially, the GaN protection transistor is made as small as possible, e.g. to take up minimal area of the chip. As an example, a GaN protection transistor having a gate width $w_g$ of only 0.7 mm can provides ESD protection for a large area GaN transistor having a gate wide $W_g$ of 300 mm. Preferably, an integrated resistor R is provided between the gate input terminal G and the connection of the drain D' of P1 to the gate of D1.

Figure 2:
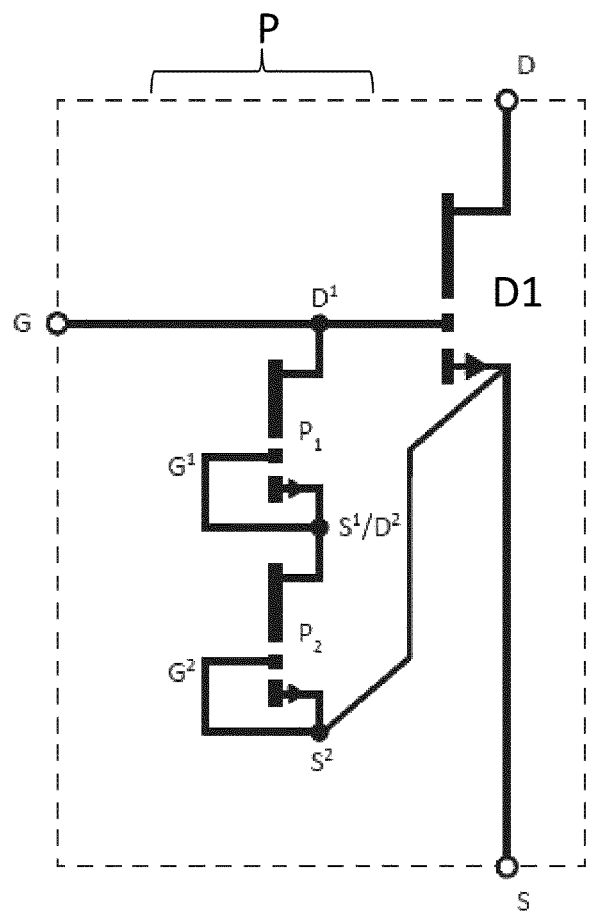
FIG. 2 shows a circuit schematic of a device comprising a large area lateral GaN transistor with an integrated gate input protection transistor arrangement according to a second embodiment.

Advantageously, as illustrated in the circuit schematic of FIG. 2, a GaN power switching device 200 comprising an integrated protection device P according to a second embodiment comprises a stack of two similar GaN protection transistors P1 and P2, connected in series. The gate G' of the first GaN protection transistor P1 is connected to its source S'. Similarly, the gate G" of the second GaN protection transistors P2 is connected to its source S". The drain D' of the first GaN protection transistor P1 is coupled to the gate input G of the lateral power transistor D1. The source S' of the first GaN protection transistor P1 is coupled to the drain D" of the second GaN protection transistor P2. The source S" of the second GaN protection transistor P2 is connected to the intrinsic source of the GaN power transistor D1. In this arrangement, the threshold voltage of the protection device is effectively the sum of the threshold voltages P1 and P2, i.e. about 3V.

A stack of multiple small GaN protection transistors increases the negative amplitude of the ESD spike required to activate the protection device. The resulting protection threshold will increase by the −Vt for each GaN protection transistor added to the stack.

Figure 3:
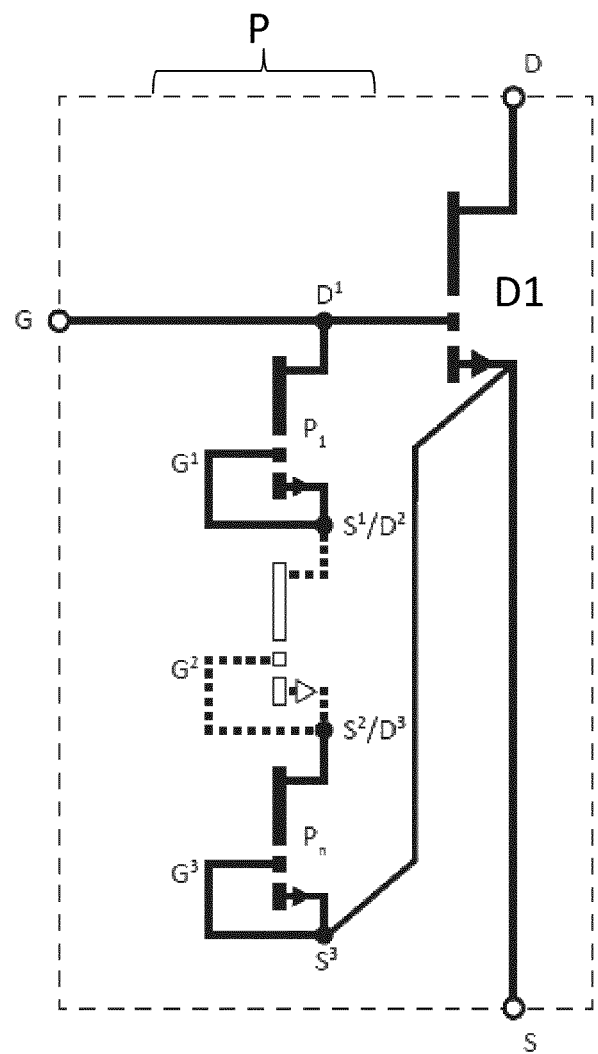
FIG. 3 shows a circuit schematic of a device comprising a large area lateral GaN transistor with an integrated gate input protection transistor arrangement according to a third embodiment.

A GaN power transistor device 300 comprising an integrated protection device P according to a third embodiment comprises a plurality of n GaN protection transistors P1 to Pn, as illustrated in the circuit schematic of FIG. 3. Each protection transistor P1, P2 . . . Pn has its gate connected to its source. The plurality of GaN protection devices are P1, P2 . . . Pn connected in series, i.e. source of the n−1th GaN protection transistor is connected to the drain of the nth GaN protection transistor, and the protection device P comprising the n transistor stack is connected between the gate input of the GaN power transistor and the intrinsic source of the GaN power transistor. In this arrangement, the threshold for turning on the protection device P is the sum of the threshold voltages of the n GaN protection transistors, i.e. n×Vth.

For a single protection transistor P1, as shown in FIG. 1, the protection device P will conduct if Vdg goes below the threshold voltage Vth of P1, i.e. about −1.6V. A protection device comprising a double stack of two similar protection transistors, as shown in FIG. 2, conducts when if Vdg falls below the sum of the threshold voltages of P1 and P2, i.e. when V<−3V. A stack of multiple protection transistors as shown in FIG. 3 will conduct when the gate voltage reaches n×Vth. Thus a stack of n GaN protection transistors can provide an effective threshold voltage that depends on the number n.

The combined gate width wg of the protection device P determines the peak voltage seen by the gate of the GaN power transistor D1. For example, in the structure of the second embodiment, for a GaN power switch D1 having a gate width Wg of 300 mm, a stack of two GaN protection transistors P1 and P2, that provides a combined gate width $w_g$ of 1.4 mm can keep Vg of the GaN power transistor above a critical limit, e.g. −10V.

This simple integrated gate protection structure uses the intrinsic reverse conduction of the GaN power transistors, such as GaN HEMTs, to help protect the gate against ESD.

Thus, an integrated GaN protection device is provided for ESD protection of large area E-mode lateral GaN transistors and systems comprising such GaN power transistors.

For a single protection transistor P1, the protection device will conduct if Vdg goes below the threshold voltage Vth of P1, i.e. about −1.6V. A protection device comprising a double stack of two similar protection transistors, as shown in FIG. 2, conducts when Vdg falls below the sum of the threshold voltages of P1 and P2, i.e. when V<−3V. Thus, a larger number n of protection transistors P1 . . . Pn controls the voltage which turns on the protection device.

The combined gate width $w_g$ of the protection device P determines the peak voltage seen by the gate of the GaN power transistor D1.

Figure 4:
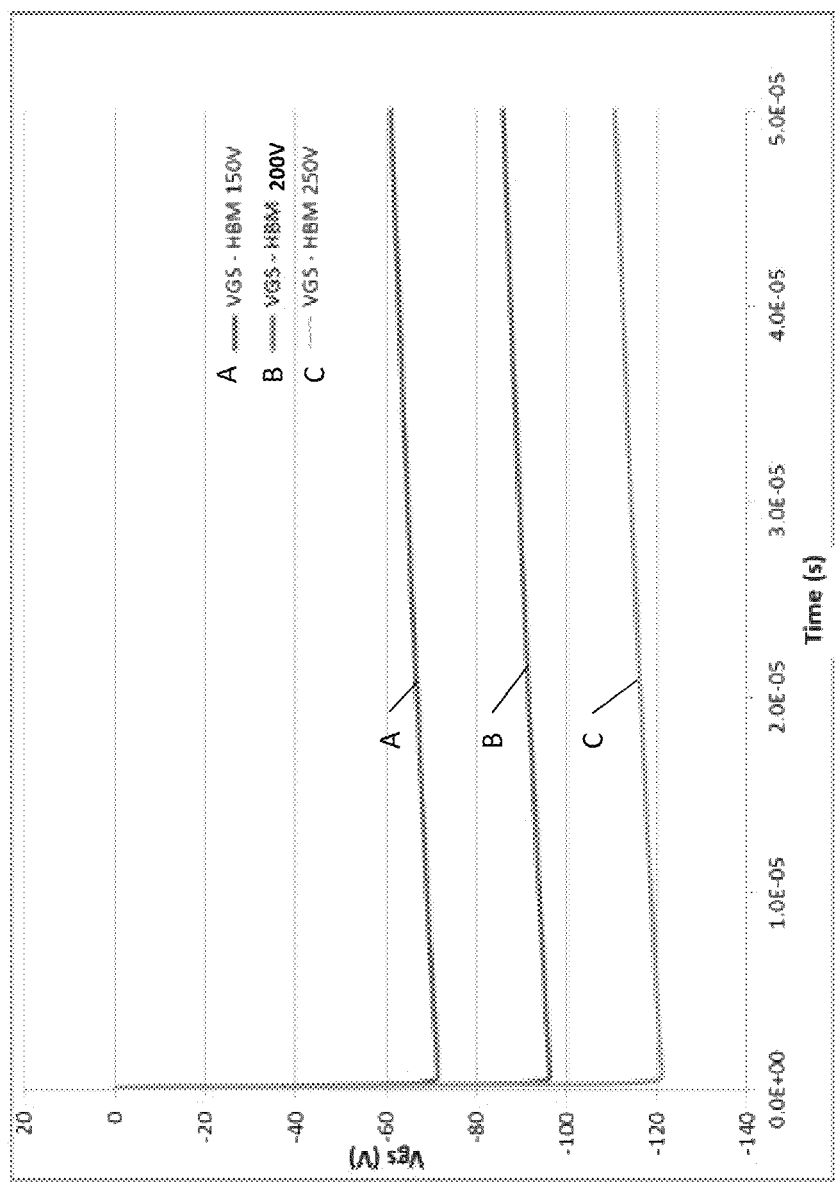
FIG. 4 shows a plot of the gate source voltage vs. time after application of a negative high voltage spike, for a lateral GaN transistor without integrated gate protection.
Figure 5:
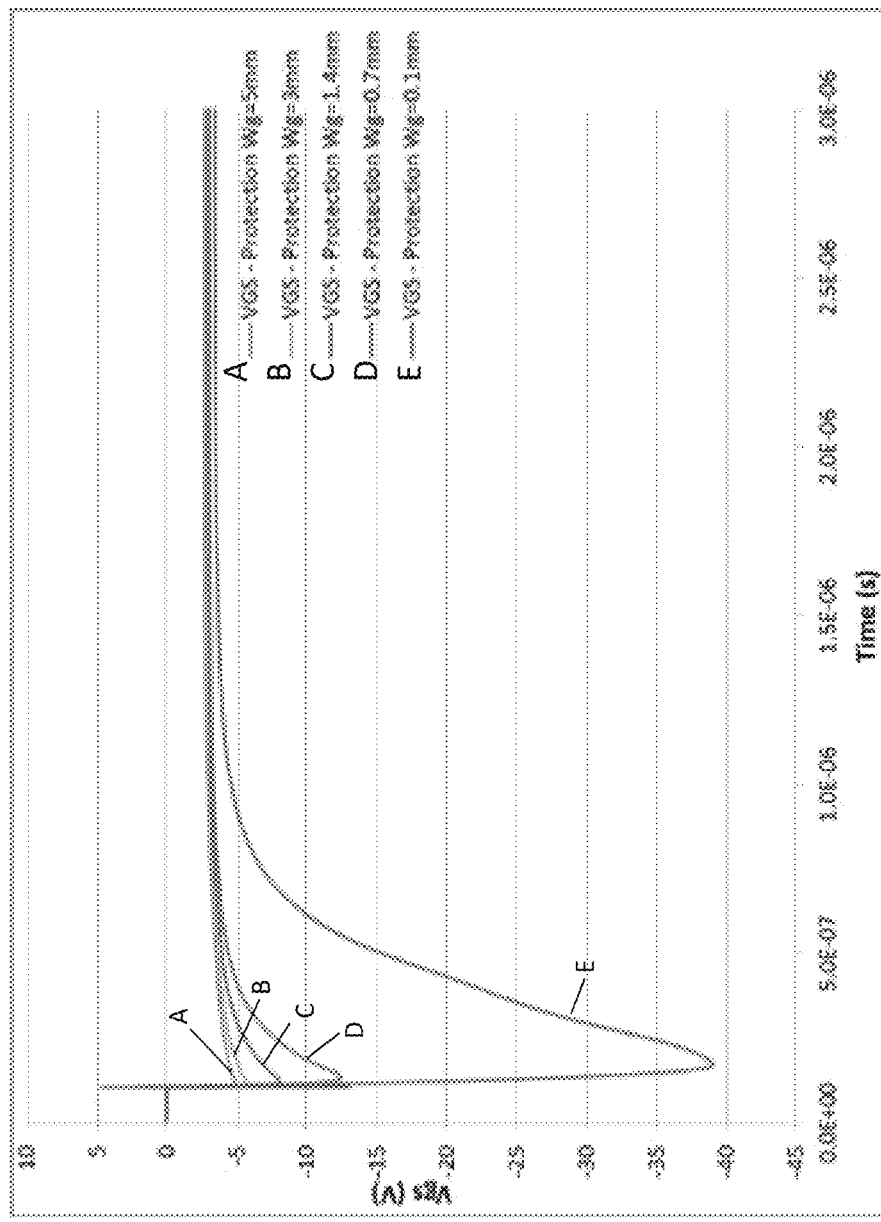
FIG. 5 shows a plot of the gate source voltage vs. time after application of a negative high voltage spike, for a lateral GaN transistor with integrated gate protection comprising gate protection transistor arrangements of different gate widths.

FIGS. 4 and 5 provided a comparison of performance based on simulated ESD testing for a GaN power transistor with and without gate input protection. The ESD model used for these simulations is the Human Body Model (HBM).

FIG. 4 shows a graph with plots A, B and C of the gate-source voltage (Vgs) vs. time after application of a negative high voltage spike, for a discharge voltage Vgs of −150V, −200V and −250V respectively, for a large lateral GaN transistor, in this example a GaN Systems GS66508P, without integrated gate protection. As shown, the gate G of the device D1 sees a sustained voltage of nearly half of discharge voltage. When the transistor is off, only leakage helps to reduce voltage with time.

FIG. 5 shows a graph with plots A to E of the gate-source voltage vs. time after application of a negative high voltage spike, Vgs of −150V for a lateral GaN transistor D1 with integrated gate protection according to an embodiment of the present invention, similar to that shown in FIG. 2, comprising a double-stack of transistors P1 and P2, which would turn on if a negative ESD spike falls below the combined threshold voltage of the two transistors, i.e. <−3V. Results are shown for different combined gate widths $w_g$ of P1 and P2, i.e. in the range from 0.1 mm to 5 mm.

As illustrated in FIG. 5, the gate of the GaN power transistor D1 sees a reduction of the negative peak voltage reduction with increasing size, i.e. with increasing combined gate width wg, of the protection device comprising protection transistors P1 and P2. These results illustrate that a protection device according to the second embodiment, comprising a double-stack of transistors P1 and P2, with a combined gate width wg=1.4 mm limits the gate voltage excursion and keeps the gate voltage of the power transistor D1 above a critical −10V limit.

Thus, the number of GaN protection transistors P1 to Pn in the stack is selected to provide a suitable effective threshold voltage for the protection device P to turn on, and the gate width is selected to limit the peak negative voltage seen by the gate of the GaN power transistor D1. Preferably, the gate width is a minimum required limit the gate voltage excursion of D1, i.e. to maintain the peak negative voltage above a desired critical value, such as >−10V.

Figure 6:
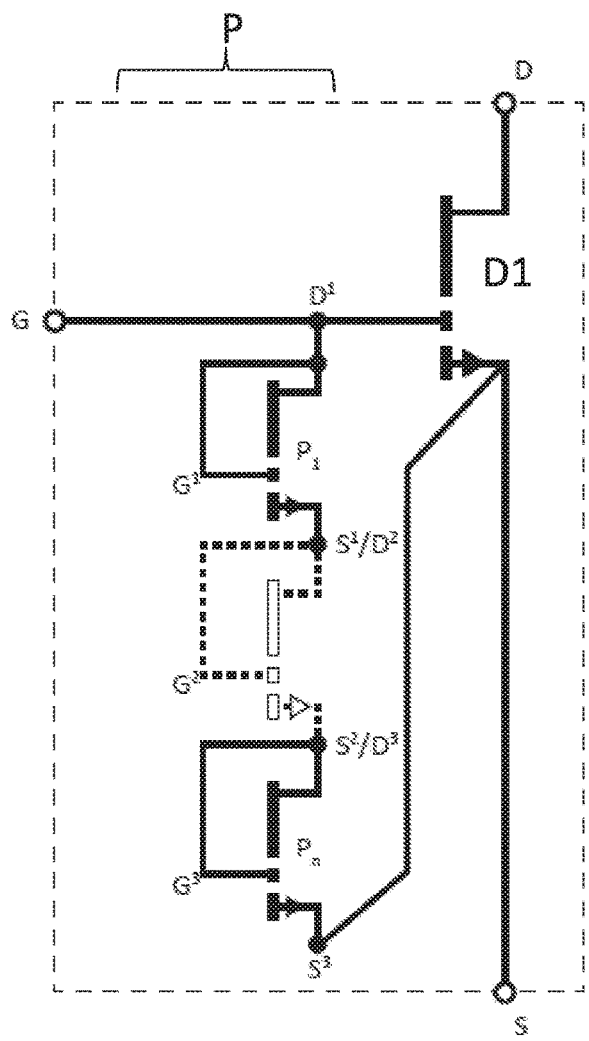
FIG. 6 shows a circuit schematic of a device comprising a large area lateral GaN transistor with an integrated gate input protection transistor arrangement according to a fourth embodiment.

A GaN power transistor device 400 comprising a protection device P according to a fourth embodiment comprises a plurality of n GaN protection transistors P1 to Pn, as illustrated in FIG. 6, which allows for protection against positive voltage spikes. In this embodiment, each protection transistor P1, P2 . . . Pn has its gate connected to its drain (instead of to its source as in embodiments described above). The plurality of GaN protection devices are P1, P2 . . . Pn connected in series, i.e. source of the n-lth GaN protection transistor is connected to the drain of the nth GaN protection transistor, and the protection device comprising the n transistor stack is connected between the gate input of the GaN power transistor and the intrinsic source of the GaN power transistor. In this arrangement, the threshold for turning on the protection device is the sum of the threshold voltages of the n GaN protection transistors i.e. n×Vth for n similar protection transistors, and thus turns on when a positive voltage spike on the gate of the GaN power switching transistor D1 reaches n×Vth. The number of protection transistors Pn is selected to provide an appropriate combined positive threshold voltage for the protection device P to turn on.

Since the gate of power switching device D1 must be driven at sufficient voltage for effective operation, the turn on voltage of the protection device must be above the normal operational voltage, e.g. at least 8V. The combined gate width is selected to limit the peak positive voltage seen by the gate of the GaN power switching transistor D1. For example, the gate width of the protection device P is selected to limit the peak gate voltage excursion of the GaN power transistor D1 to between 10V and 16V.

In other embodiments, protection devices such as those illustrated in the embodiments described above may be combined on the same chip to provide both positive and negative spike protection.

Figure 7:
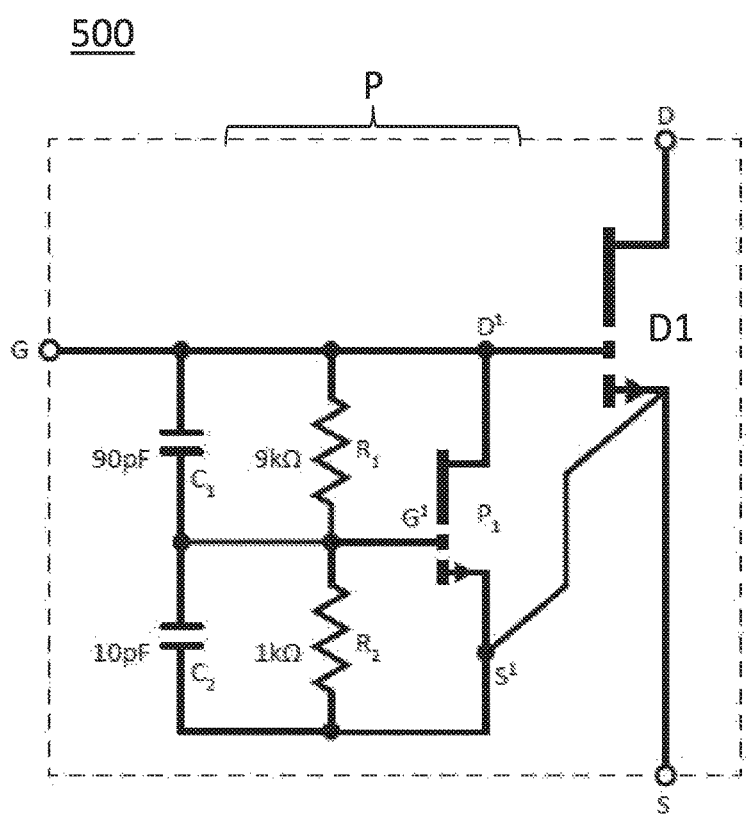
FIG. 7 shows a circuit schematic of a device comprising a large area lateral GaN transistor with a gate input protection arrangement according to a fifth embodiment.

A GaN power transistor device 500, according to a fifth embodiment, is illustrated in the circuit schematic of FIG. 7. This device comprises a GaN power transistor D1 and protection device P comprising protection transistor P1 and a voltage divider comprising resistors, R1 and R2, and capacitors, C1 and C2. Protection transistor P1 is arranged to become active, dependant on the values of the resistors R1/R2 and capacitors C1/C2 chosen for the voltage divider. By way of example, for the R/C component values having the ratios shown in FIG. 7, and assuming that the threshold voltage of P1 is 1.6 volts, the transistor P1 becomes active if the voltage at the gate input G exceeds 16 volts. Device P1 can conduct in either direction so that positive and negative excess voltages can be clamped to protect the power switch D1. However, such an arrangement using resistors and capacitors requires discrete components.

Figure 8:
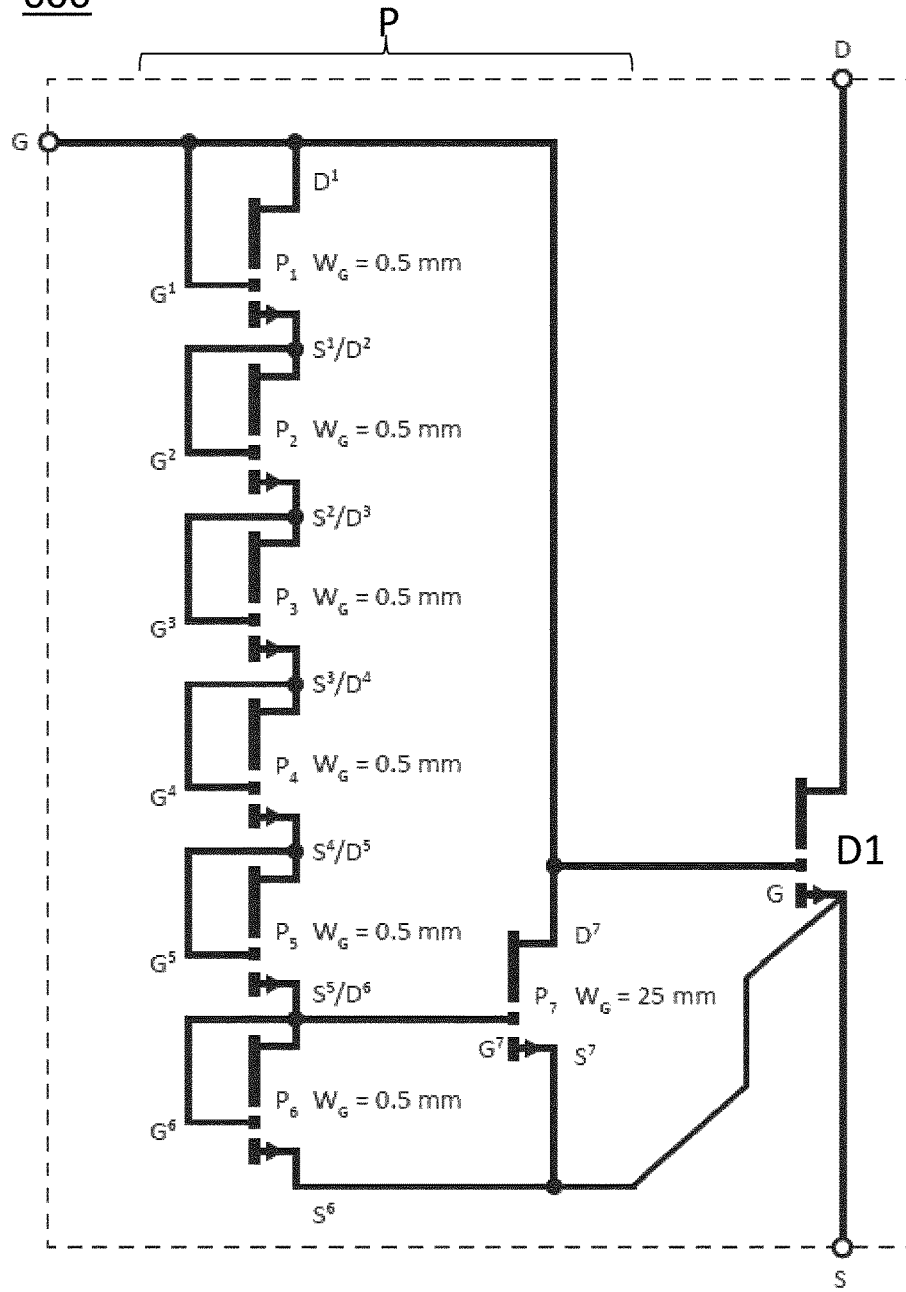
FIG. 8 shows a circuit schematic of a device comprising a large area lateral GaN transistor with an integrated gate input protection transistor arrangement according to a sixth embodiment.

A GaN power transistor device 600 comprising a GaN power transistor D1 and a protection device P according to a sixth embodiment is illustrated in FIG. 8. Protection transistor P7 is shown to be a relatively large area device, e.g. gate width Wg=25 mm, because the circuit is able to protect against high energy levels that may be present in the machine model ESD tests. In this circuit, voltage division is achieved using a string of six protection transistors P1 . . . P6, each having a gate width $w_g$=0.5 mm. Assuming that the threshold voltage is 1.6 volts, the circuit will begin to clamp as the voltage at G exceeds about 10 volts. Very hard clamping would occur as the input voltage exceeds 18 volts. Using the less demanding human body ESD model, the circuit begins to clamp at 10 volts but is able to hold the input voltages to 12 volts, as illustrated by the simulation results shown in FIG. 9.

Figure 9:
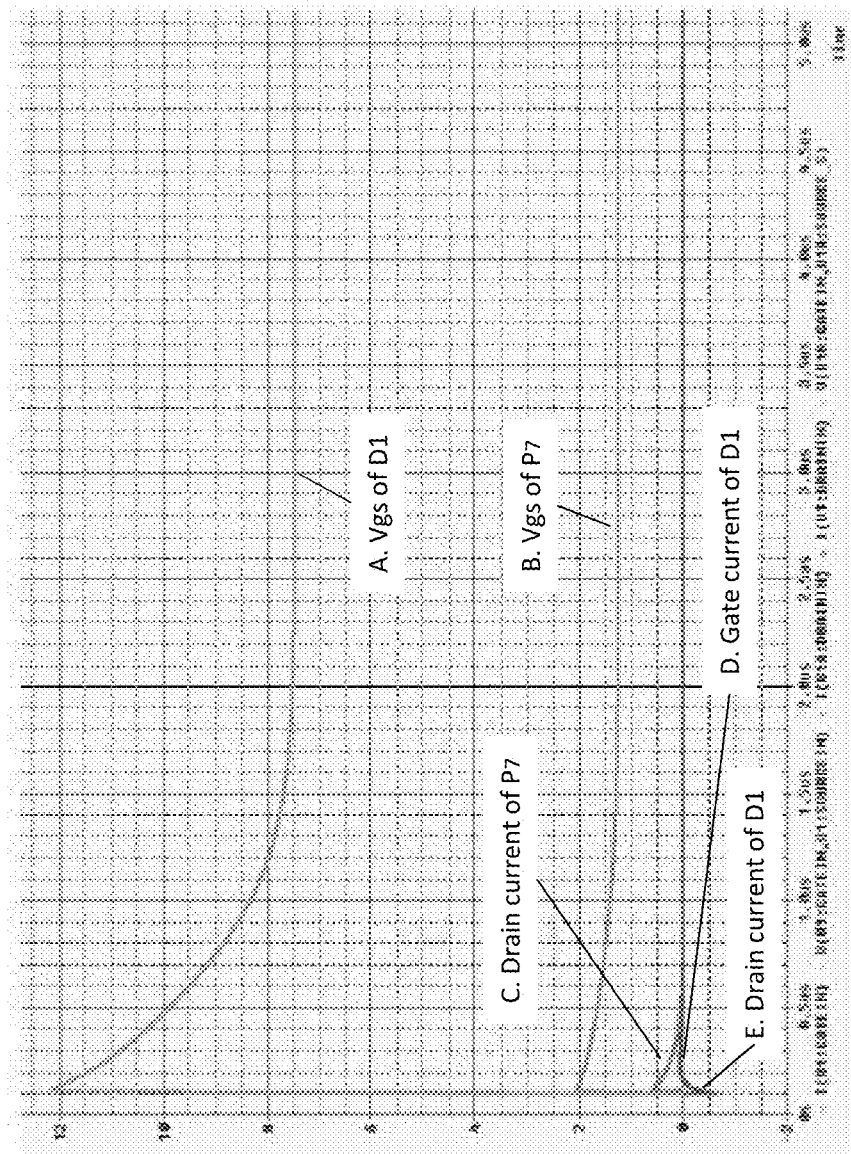
FIG. 9 shows plots of simulation results for the voltage vs. time after application of a high voltage spike, for a lateral GaN transistor with integrated gate protection comprising gate protection transistor arrangement as shown in FIG. 8.

FIG. 9 shows plots of the voltage and current vs. time for the GaN power transistor D1 (labelled as U1 in the legend of FIG. 9) and for the protection transistor P7 (labelled as U18 in the legend of FIG. 9) of the device structure shown in FIG. 8. The trace A represents the input gate voltage Vgs of D1; the trace B represents the input gate voltage Vgs of P7; trace C represents the drain current of P7; the trace D represents the drain current of D1; and trace E represents the gate current of D1.

While specific embodiments have been described in detail above with reference to the figures, by way of example, it will be appreciated that modifications and variations of the embodiments may be made. Specific values of components, e.g. gate widths of the GaN transistors, resistor and capacitor values, are shown by way of example only. Simulation results are based on a HBM ESD model and an example of a large area, lateral GaN power transistor. These results are also provided by way of example only.

Although embodiments of the invention have been described and illustrated in detail, it is to be clearly understood that the same is by way of illustration and example only and not to be taken by way of limitation, the scope of the present invention being limited only by the appended claims.

The invention claimed is:

1. A GaN power switching device comprising a GaN power transistor D1 and an integrated gate protection device P for negative ESD spike protection,
   the GaN power transistor D1 comprising an enhancement mode GaN power transistor having a drain, an intrinsic source, and a gate of gate width Wg;
   the integrated gate protection device P comprising first and second GaN protection transistors P1 and P2, each comprising an enhancement mode GaN transistor having a source, a drain, a gate of gate width $w_g$ smaller than Wg, and having its gate connected to its source,
   the first and second GaN protection transistors P1 and P2 being connected in series as a stack, with the source of the first GaN protection transistor P1 being connected to the drain of the second GaN protection transistor P2; the drain of the first GaN protection transistor P1 being connected to a gate input of the GaN power transistor D1, and the source of the second GaN protection transistor P2 being connected to the intrinsic source of the GaN power transistor D1;
   an effective threshold voltage of the integrated gate protection device P being a sum of threshold voltages for reverse conduction of the GaN protection transistors P1 and P2,
   wherein, the integrated gate protection device P is normally off, and when a gate input voltage of the GaN power transistor D1 applied to the drain of P1 is taken negative by more than the effective threshold voltage, the integrated gate protection device P conducts, and
   wherein the sum of threshold voltages for reverse conduction of P1 and P2 is −3V or less, and gate widths $w_g$ of P1 and P2 are selected to limit a negative gate voltage excursion of D1 to maintain a gate voltage of D1 above −10V.

2. A GaN power switching device comprising a GaN power transistor D1 and an integrated gate protection device P for negative ESD spike protection, the GaN power transistor D1 comprising an enhancement mode GaN power transistor having a drain, an intrinsic source, and a gate of gate width Wg;

the integrated gate protection device P comprising a plurality of n GaN protection transistors P1, P2, . . . Pn, each comprising an enhancement mode GaN transistor having a drain, a source and a gate of gate width $w_g$ smaller than Wg, the gate of each GaN protection transistor P1, P2, . . . Pn being connected to its source;

the n GaN protection transistors being connected in series as a stack, for i=1 to n−1, the source of the ith GaN protection transistor being connected to the drain of the i+1th GaN protection transistor, the drain of first GaN protection transistor P1 being connected to a gate input of the GaN power transistor D1, the source of the nth GaN protection transistor Pn being connected to the intrinsic source of the GaN power transistor D1;

an effective threshold voltage of the protection device P being a sum of threshold voltages for reverse conduction of each of the n GaN protection transistors P1, P2, . . . Pn, wherein, the GaN protection device P is normally off, and when a gate input voltage of the GaN power transistor D1 applied to the drain of P1 is taken negative by more than the effective threshold voltage, the GaN protection device P conducts, and a gate width of the protection device P being a combined gate width of the stack of n GaN protection transistors P1, P2, . . . Pn, the gate width of the protection device P being selected to limit a negative gate voltage excursion of the gate of GaN power transistor D1; and wherein number n of GaN protection transistors P1, P2, . . . Pn is selected to set the effective threshold voltage of the GaN protection device P at −3V or less.

3. The device of claim 2 wherein the gate width of the protection device P is selected to limit the negative gate voltage excursion of the GaN power transistor D1 and maintain a gate voltage of D1 above −10V.

4. The device of claim 2 further comprising an integrated resistor connected between a gate input terminal of D1 and a connection of the drain of P1 to the gate of D1.

5. The device of claim 2, wherein the gate width of the protection device P is selected to limit the negative gate voltage excursion of the GaN power transistor D1 and maintain a gate voltage of D1 above −10V, and further comprising an integrated resistor connected between a gate input terminal of GaN power transistor D1 and a connection of the drain of P1 to the gate of GaN power transistor D1.

6. A GaN power switching device comprising a GaN power transistor D1 and an integrated gate protection device P for positive spike ESD protection, the GaN power transistor D1 comprising an enhancement mode GaN power transistor having a drain, an intrinsic source and a gate of gate width Wg;

the integrated gate protection device P comprising a plurality of n GaN protection transistors P1, P2, . . . Pn, each comprising an enhancement mode GaN transistor, having a drain, a source and a gate of gate width $w_g$ smaller than Wg, the gate of each GaN protection transistor P1, P2, . . . Pn being connected to its drain;

the n GaN protection transistors being connected in series as a stack, for i=1 to n−1, the source of the ith GaN protection transistor being connected to the drain of the i+1th GaN protection transistor, the drain of first GaN protection transistor P1 being connected to a gate input of the GaN power transistor D1, the source of the nth GaN protection transistor Pn being connected to the intrinsic source of the GaN power transistor D1;

an effective threshold voltage of the protection device P comprising the stack of n GaN protection transistors being the sum of threshold voltages for conduction of each of the n GaN protection transistors P1, P2, . . . Pn, wherein the GaN protection device P is normally off, and when a gate input voltage of the GaN power transistor D1 applied to the drain of P1 is taken positive by more than the effective threshold voltage, the GaN protection device P conducts, and a gate width of the protection device P being a combined gate width of the stack of n GaN protection transistors P1, P2, . . . Pn, the gate width of the protection device P being selected to limit a positive gate voltage excursion of the gate of GaN power transistor D1; and wherein number n of GaN protection transistors P1 to Pn is selected to set the effective threshold voltage of the GaN protection device P to be at least 8V.

7. The device of claim 6, wherein the gate width of the protection device P is selected to limit a peak gate voltage excursion of the GaN power transistor D1 to between 10V and 16V.

8. A GaN power switching device comprising a GaN power transistor D1 and an integrated gate protection device P for ESD spike protection, the GaN power transistor D1 comprising an enhancement mode GaN power transistor having a drain, an intrinsic source and a gate of gate width Wg;

the integrated gate protection device P comprising a GaN protection transistor Pm and a voltage divider, the GaN protection transistor comprising an enhancement mode GaN transistor, having a drain, a source and a gate of gate width $w_g$ smaller than Wg, the drain of the GaN protection transistor Pm being connected between the gate and a gate input terminal of the GaN power transistor D1, and the source of the GaN protection transistor Pm being connected to the intrinsic source of the GaN power transistor D1; and the voltage divider connected between the gate input terminal of GaN power transistor D1 and the drain and the source of the protection transistor Pm for controlling a gate voltage to the GaN protection transistor Pm the voltage divider being configured to divide an input voltage applied to gate input terminal of GaN power transistor D1 in a required ratio such that when an input voltage at the gate input terminal of GaN power transistor D1 exceeds a threshold voltage of protection transistor Pm by a selected multiple, the GaN protection transistor Pm conducts, and wherein, because the GaN protection transistor Pm can conduct in either direction, positive and negative excess voltages are thereby clamped to protect the GaN power transistor D1.

9. The GaN power switching device of claim 8, wherein the voltage divider comprises an integrated voltage divider comprising a string of a plurality n of enhancement mode GaN protection transistors P1 to Pn, each having a drain, a source and a gate of a gate width smaller than the gate width $w_g$ of the GaN protection transistor Pm, and the string of n GaN protection transistors P1 to Pn being arranged to divide the input voltage in the required ratio; each of the string of GaN protection transistors P1 to Pn having its gate connected to its drain, with the drain of first transistor P1 being connected between the gate and the gate input terminal of GaN power transistor D1 and the source of nth transistor Pn being connected to the source of protection transistor Pm, and the drain of the nth transistor Pn being connected to the gate of protection transistor Pm.

10. A GaN power switching device comprising a GaN power transistor D1 and an integrated gate protection device P for negative and positive ESD spike protection,
the GaN power transistor D1 comprising an enhancement mode GaN power transistor having a drain, an intrinsic source, and a gate of gate width Wg;
the integrated gate protection device P comprising a GaN protection transistor Pm comprising an enhancement mode GaN transistor having a drain, a source, and a gate of gate width $w_{g(m)}$ smaller than Wg,
the gate of the GaN protection transistor Pm being connected to the source of the GaN protection transistor Pm, the drain of the GaN protection transistor Pm being connected to a gate input of the GaN power transistor D1, and the source of the GaN protection transistor Pm being connected to the intrinsic source of the GaN power transistor D1;
wherein, the GaN protection device P is normally off, and when a gate input voltage of the GaN power transistor D1 applied to the drain of the GaN protection transistor Pm is taken negative by more than a threshold voltage for reverse conduction of GaN protection transistor Pm, the protection device P conducts; and
a string of a plurality n of enhancement mode GaN protection transistors P1 to Pn, each having a smaller gate width $w_{g(n)}$ than that of the protection transistor Pm, P1 to Pn being arranged as a voltage divider; each of the string of GaN protection transistors having its gate connected to its drain, with the drain of the P1 transistor being connected to the gate input of D1 and the source of Pn being connected to the source of protection transistor Pm, and the drain of the protection transistor Pn being connected to the gate of protection transistor Pm; and
wherein, the voltage divider is configured to divide the gate input voltage in a required ratio such that the protection transistor Pm becomes active if the input voltage at the gate input exceeds a threshold voltage of protection transistor Pm by a selected multiple of the threshold voltage of protection transistor Pm.

11. The GaN power switching device of claim 10, wherein the selected multiple provides a turn on voltage of at least 10V.

12. The GaN power switching device of claim 11, wherein the gate widths of Pm and P1 to Pn are selected to limit a peak voltage excursion of the gate of the GaN power transistor D1 to 12V, the protection transistor Pm having a gate width $w_{g(m)}$ of 25 mm and each of the string of enhancement mode GaN protection transistors P1 to Pn having a gate width $w_{g(n)}$ of 0.5 mm.

* * * * *